United States Patent [19]
Drab et al.

[11] Patent Number: 5,729,488
[45] Date of Patent: Mar. 17, 1998

[54] NON-DESTRUCTIVE READ FERROELECTRIC MEMORY CELL UTILIZING THE RAMER-DRAB EFFECT

[75] Inventors: John J. Drab, Encitas; O. Glenn Ramer, Los Angeles, both of Calif.

[73] Assignee: Hughes Electronics, Los Angeles, Calif.

[21] Appl. No.: 296,835

[22] Filed: Aug. 26, 1994

[51] Int. Cl.$^6$ .................................................. G11C 11/22
[52] U.S. Cl. ........................... 365/145; 365/149; 257/295
[58] Field of Search ................................. 365/117, 145, 365/149; 257/295

[56] References Cited

U.S. PATENT DOCUMENTS

| | | | |
|---|---|---|---|
| 4,791,611 | 12/1988 | Eldin et al. | 365/177 |
| 4,980,734 | 12/1990 | Inoue | 257/301 |
| 5,151,877 | 9/1992 | Brennan | 365/145 |
| 5,218,566 | 6/1993 | Papaliolios | 365/145 |
| 5,297,077 | 3/1994 | Imai et al. | 365/145 |
| 5,375,085 | 12/1994 | Gnade et al. | 365/145 |
| 5,383,150 | 1/1995 | Nakamura et al. | 365/145 |
| 5,406,510 | 4/1995 | Mihara et al. | 365/145 |

FOREIGN PATENT DOCUMENTS

| | | |
|---|---|---|
| 0 331 911 | 9/1989 | European Pat. Off. . |
| 0551756 | 7/1993 | European Pat. Off. . |
| 753944 | 8/1956 | United Kingdom . |
| 1233911 | 6/1971 | United Kingdom . |

Primary Examiner—Joseph A. Popek
Attorney, Agent, or Firm—Georgann S. Grunebach; Michael W. Sales; Wanda K. Denson-Low

[57] ABSTRACT

A memory cell is constructed using a ferroelectric capacitor having an insulator formed of a ferroelectric material that has a zero field capacitance which is controllably dependent upon the electrical charging path by which the zero field capacitance is reached. Preferably, the material is characterized by a first zero field capacitance following saturation of the polarization by a first applied voltage applied in a first polarization direction, and a second zero field capacitance following saturation of the polarization by the first applied voltage applied in the first polarization direction followed by partial depolarization by a second voltage applied in a direction opposite to the first polarization direction. A second ferroelectric capacitor or a linear capacitor may be placed in parallel with the ferroelectric capacitor to form a two-capacitor memory cell. Data may be read to or from the capacitor cell without impairing the state of the stored data.

17 Claims, 3 Drawing Sheets

NON-DESTRUCTIVE READ FERROELECTRIC MEMORY CELL UTILIZING THE RAMER-DRAB EFFECT

This invention relates to a random, access memory, and, more particularly, to such a memory that can be interrupted during readout without loss of the stored information.

Many military and some civilian systems require data storage capability in a random access memory that is nonvolatile and resistant to data loss due to disruptive events. A nonvolatile memory retains the stored data even when power is turned off for a period of time. Such nonvolatile memories are often based on physical changes that occur in a memory element when data is stored, which physical changes are not reversed or randomized upon the loss of power.

Ferroelectric materials have been successfully developed for use in nonvolatile memories. A ferroelectric material is one whose physical state changes upon the application of an electrical field, in a manner analogous with the change undergone by ferromagnetic materials to which a magnetic field is applied. The ferroelectric material has the advantages that its physical state can be controlled by the application of a voltage rather than a magnetic field, a measurable physical state is retained after a power loss, and small-size memory elements can be constructed by microelectronics fabrication techniques, which result in memory elements which consume little power.

Random access memories can be classified as destructive readout (DRO) and nondestructive readout (NDRO). In the destructive readout memory, the physical state of the memory unit is altered upon readout such that the stored data value is lost to the memory unless further action is taken. To avoid this loss of information, the stored value must be refreshed after each readout so that the stored data are available for a subsequent readout. In the absence of refreshing of the data, it is possible to read the data only once.

In many applications, it may be assumed that refreshing can reliably occur as a regular part of a readout/refresh cycle. Destructive readout memories may therefore be employed in such situations. In other applications, however, that assumption cannot be made because there may be a disruption experienced by the system in the brief period of time between the moment when the readout is accomplished and the moment when refresh would normally occur. Such disruptions can result due to, for example, power interruptions to civilian systems and nuclear events which may be experienced by military systems.

To date, ferroelectric destructive readout memories have been developed and applied. While useful for some applications, such memories are of limited value where the system must be resistant to the effects of disruptive events a nondestructive readout (NDRO) ferroelectric memory would have application in situations where the memory state must be retained through extended power outages and also must be stable through brief, multiple disruptions that may occur while the memory is being read. Several nondestructive readout memory approaches have been proposed. However, none are truly nondestructive in the sense that the data may be read an arbitrarily large number of times without refresh.

SUMMARY OF THE INVENTION

The present invention provides a ferroelectric-based memory that is nonvolatile. The memory utilizes a true nondestructive readout and is stable against data loss resulting from disruptions. The memory provides usable readout signals even after an indefinitely large number of disruptions and/or reads without refreshing. The memory utilizes little power and is compact. It may be fabricated using microelectronic fabrication techniques. The memory may be provided in a form that is also hardened and stable against radiation damage.

In accordance with the invention, a memory unit is based upon a ferroelectric capacitor having an insulator formed of a ferroelectric material characterized by a zero field capacitance that varies according to the manner in which the zero field state is reached. The material reaches the first zero field capacitance after the polarization has been saturated by applying a voltage of at least several times the coercive voltage in one direction. To obtain the second zero field capacitance, the material is first saturated by applying a field of at least several times the coercive field of the material (as above), followed by a partial depolarization by application of a field of about the coercive field in the opposite direction to the initial saturation.

The memory unit may use one or two of these ferroelectric capacitors, arranged in parallel if there are two. The memory unit includes means for writing two different polarization states to the ferroelectric capacitor(s), the different polarization states reflecting different stored data values. There is also means for reading the capacitance(s) of the ferroelectric capacitor(s), without switching the charge state of the ferroelectric capacitor(s) and without applying a DC bias field to the ferroelectric capacitor(s). If only a single ferroelectric capacitor is used in the memory unit, the absolute values of the two zero field capacitances must be recognized so that they may be distinguished from each other. If two ferroelectric capacitors are used, the information may be stored as a relative capacitance value. The latter is preferred, because of possible variations in the characteristics of individual ferroelectric capacitors that are formed in large memory arrays.

Storing the information as a polarization state in a ferroelectric capacitor renders the memory nonvolatile. The ferroelectric polarization state changes only under the application of an input field, so that the stored information will not be lost in the event of a power outage. When the stored data is read, only the capacitance is sensed, and there is no switching of charge or polarization state. Consequently, the data may be read from the memory unit as many times as desired without altering the state of the ferroelectric capacitors or the stored data. The memory is therefore immune to data loss by power outages at any time or disruptions during the read/write cycle.

The present invention provides an advance in the art of random access memories. The memory of the invention is nonvolatile and utilizes a truly nondestructive storage and readout that is resistant to disruptions occurring when the stored data is being read.

DETAILED DESCRIPTION OF THE INVENTION

Figure 1:
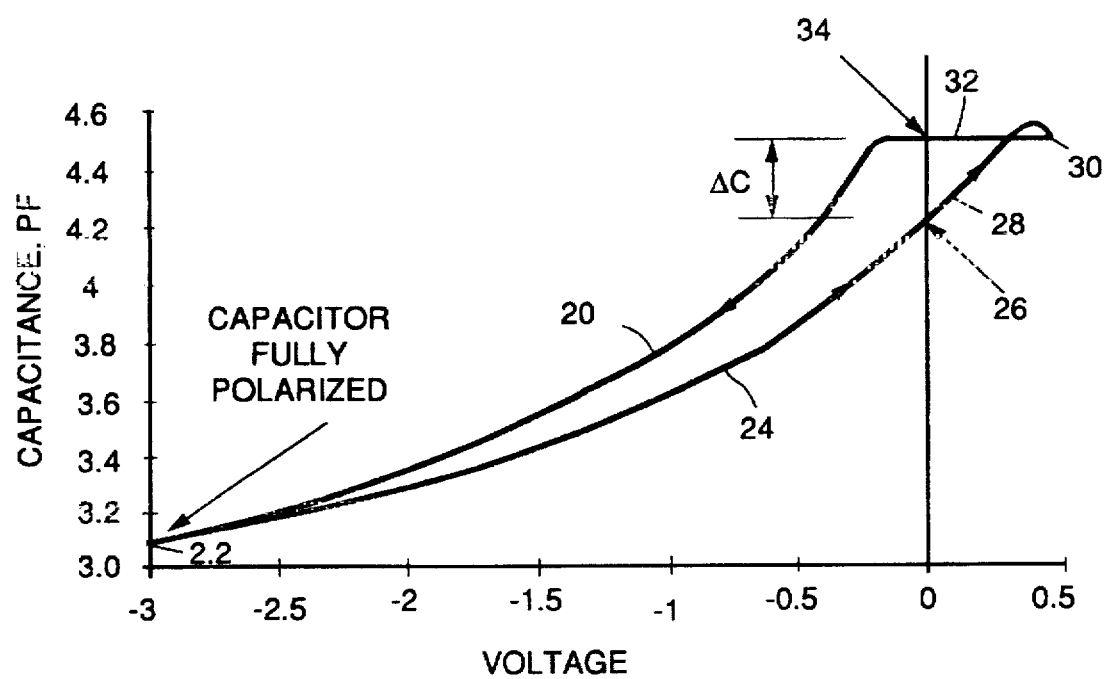
FIG. 1 is a capacitance-voltage plot for a Y1 ferroelectric material used in the present invention.

The present invention is based upon the utilization of a newly observed phenomenon found in some ferroelectric materials, which has been named the Ramer-Drab Effect. FIG. 1 depicts the capacitance-voltage characteristic of a ferroelectric material used in the present invention as the insulator in a ferroelectric capacitor. The useful capacitance characteristics can best be understood in a discussion of the behavior of the material during the application of an electric field to the material. Throughout the discussion reference is made to a "Y1" material that constitutes the preferred ferroelectric material exhibiting the Ramer-Drab Effect. These references are made not by way of limitation of the effect and its application, but by way of illustration of values and properties.

FIG. 1 is a capacitance-voltage plot for a material exhibiting the Ramer-Drab Effect, in this case the Y1 material. As a negative voltage of at least about six times the coercive voltage, or about −3 volts or greater in the case of Y1 material, is applied across the ferroelectric material, the capacitance of the ferroelectric material follows curve 20 to the left to the fully polarized state 22. When the electric field is removed, the capacitance follows the curve 24 to the right, to a first zero field capacitance 26. Thus, creation of a saturated polarization state in a first direction results in the first zero field capacitance 26.

Is a voltage is next applied in the opposite direction across the ferroelectric material, a positive voltage the illustration, the capacitance follows the extension of curve 24, indicated as curve 28. As the positive voltage increases, the polarization state of the ferroelectric material changes from the fully saturated polarization state to a partially polarized state. However, in the present approach the applied positive voltage is less than that required to fully saturate the polarization state, and is preferably about equal to the coercive voltage, as shown in FIG. 1 at numeral 30.

When the voltage is returned to zero, along curve the capacitance is measured as a second zero field capacitance 84. The second zero field capacitance 34 differs from the first zero field capacitance 26 by a relatively small, but definite and measurable, capacitance difference (delta C). The capacitance difference is typically on the order of about 10 percent of the capacitance values and is independent of the voltages applied.

A memory unit can therefore be based upon writing to a single ferroelectric capacitor to establish the first zero field state 26 to record one sense of a binary data bit (e.g., the "0" state) and, at some other time, to establish the second zero field state 34 to record the other sense of the binary data bit (e.g., the "1" state). The data is read from the memory unit by sensing the capacitance value in a conventional manner. If, as is preferred, the sensing of the capacitance is implemented such that it does not alter the polarization state, the data bit can be read from the memory as many times as desired, without requiring any refresh of the memory unit. For reasons that will be discussed subsequently, in practical applications it is preferred to use two ferroelectric capacitors arranged in parallel so that the opposite states can be alternatively written to the two ferroelectric capacitors and a differential capacitance sensed during reading of the data. This memory unit using two ferroelectric capacitors operates on the same physical principles discussed above in regard to the ferroelectric material as the memory unit using a single ferroelectric capacitor.

Figure 2:
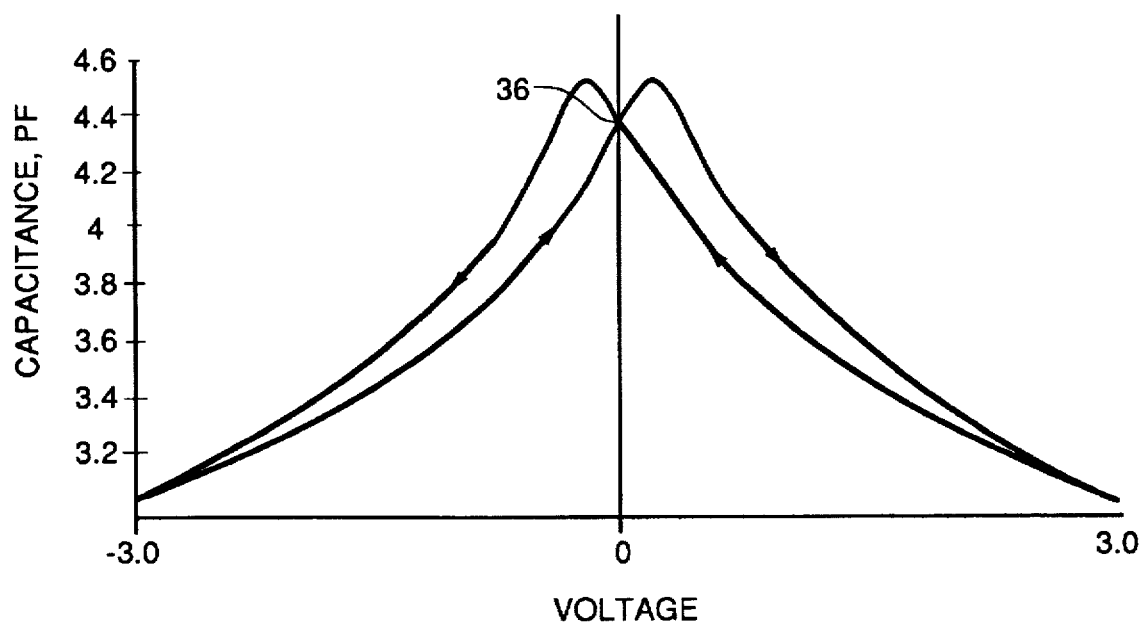
FIG. 2 is a capacitance-voltage plot for a typical conventional ferroelectric material.

FIG. 2 illustrates, by way of comparison, the capacitance behavior of a conventional ferroelectric material when driven to the fully saturated polarization states by an applied field. When the ferroelectric material is fully saturated with a negative voltage (the leftmost extent of the curves) and returned to the zero field state, a zero field capacitance 36 is observed. If the ferroelectric material is thereafter fully saturated with a positive voltage (the rightmost extent of the curves) and returned to the zero field state, the same zero field capacitance 36 is observed. That is, the zero field capacitance produced by fully saturating the polarization cannot be used itself as a data indicator.

A ferroelectric material known as Y1 exhibits the differential zero field capacitance discussed in relation to FIG. 1. The preferred Y1 ferroelectric material is a known layered superlattice ferroelectric material that is available commercially from Symetrix Corporation and is described, for example, PCT publications WO93/12542, WO93/12538, and WO93/10627, whose disclosures are incorporated by reference. Y1 generally has a composition of

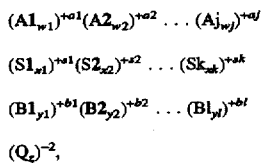

where A1, A2, . . . Aj are A-site elements in a perovskite-like structure; S1, S2, . . . Sk are superlattice generator elements; B1, B2, and Bl are B-site elements in a perovskite-like structure; Q is an anion; the superscripts indicate valences of the respective elements; the subscripts indicate the average number of atoms of the element in the unit cell of the perovskite-like structure, and at least w1 and y1 are non-zero. Examples of A-site elements include strontium, calcium, barium, bismuth, cadmium, and lead; examples of B-site elements include titanium, tantalum, hafnium, tungsten, niobium, and zirconium; examples of superlattice generator elements include bismuth, scandium, yttrium, lanthanum, antimony, chromium, and thallium; examples of anions include oxygen, chlorine, and fluorine.

The layered superlattice ferroelectric materials such as Y1 are highly resistant to fatigue of the polarization properties. Many other ferroelectric materials exhibit a degradation in their polarization properties after numerous state switches of the type required in a ferroelectric memory device. Materials such as Y1 are not subject to much, if any, fatigue-based degradation.

Figure 3:
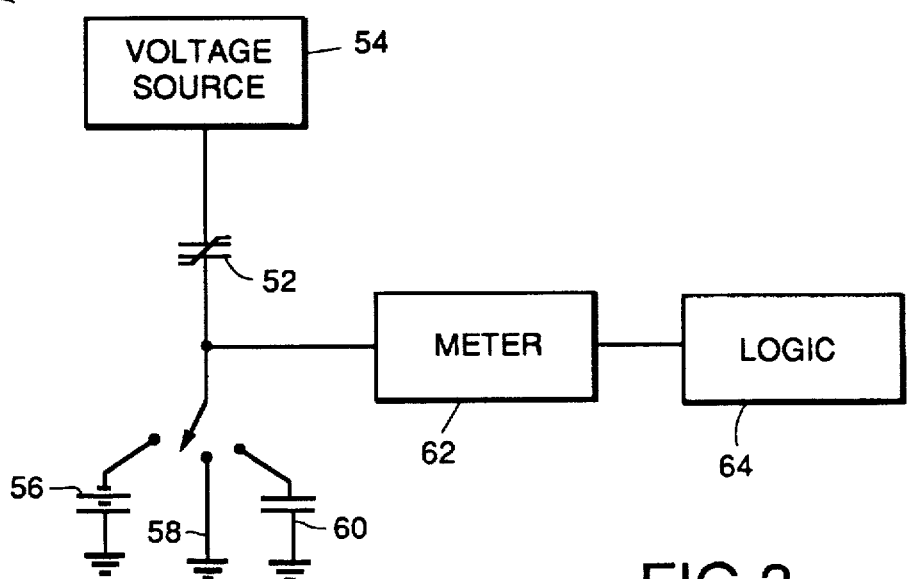
FIG. 3 is a schematic drawing of a basic memory unit using a single ferroelectric capacitor.

FIG. 3 depicts a basic form of a memory unit 50 having a single ferroelectric capacitor 52 whose insulator shows the differential-capacitance phenomenon. A first side of the ferroelectric capacitor 52 is connected to a variable voltage source 54. A second side is switchably connected to a saturating voltage source 56 having a voltage sufficient high to fully saturate the ferroelectric capacitor 52, to ground 58, or to a measurement capacitor 60. A voltmeter 62 also communicates with the second side of the ferroelectric capacitor 52.

Data is written to the memory unit 50 by connecting the second side of the ferroelectric capacitor 52 to the saturating voltage source 56 to fully saturate the ferroelectric capacitor 52 in the negative direction, and thereafter connecting the second side of the ferroelectric capacitor to ground 58. A voltage pulse is produced by the variable voltage source 54.

If the ferroelectric capacitor is to be left in the first zero field capacitance state to record, for example, a "0" data bit, the voltage pulse has a zero voltage. If the ferroelectric capacitor is to be left in the second zero field capacitance state to record, for example, a "1" data bit, the voltage pulse has a positive voltage as shown in FIG. 1, preferably equal to about the coercive voltage of the ferroelectric capacitor. In the case of a typical Y1 material, the negative saturating voltage is −4 volts, and the positive voltage is about 0.5 volts.

The data is read by any approach that can sense the capacitance value of the ferroelectric capacitor 52. The reading approach preferably does not utilize a switching of charge in the ferroelectric capacitor, as this would reduce the number of possible interrupted reads to a value that depends upon the switched charge. The reading approach also preferably does not utilize the application of a DC biasing voltage to the ferroelectric capacitor, as this requires additional circuitry and can also cause switching of charge.

In the illustrated memory cell 50, data is read from the ferroelectric capacitor 52 by connecting the second side of the ferroelectric capacitor 52 to ground through the measurement capacitor 60, applying a small read voltage pulse, typically about 1 volt, to the first side of the ferroelectric capacitor 52 using the voltage source 54, and sensing the voltage on the second side of the ferroelectric capacitor 52 using the voltmeter 62. The greater the measured voltage, the higher the capacitance of the ferroelectric capacitor 52. A read logic unit 64 uses the values of the first zero field capacitance state and the second zero field capacitance state used to store the data bit, together with the measured voltage produced by the read pulse, to determine the identity of the stored data.

While operable, the memory cell 50 has the drawback that the absolute values of the two zero field capacitances must be known to some degree of accuracy. These values can depend upon variations in the dielectric material and the geometry of the ferroelectric capacitor. For a large memory array, the variations between individual ferroelectric capacitors may be sufficiently great that ambiguity can arise in sensing the stored data values in different ferroelectric capacitors. Reference values must also compensate for temperature effects in the ferroelectric capacitors.

To overcome this problem, known techniques for constructing two-capacitor memory units can be used. The two-capacitor memory unit allows information to be stored as the sense (i.e., positive or negative difference) of the capacitances of the two capacitors, so that the absolute values of capacitance of the capacitors need not be known.

Figure 4:
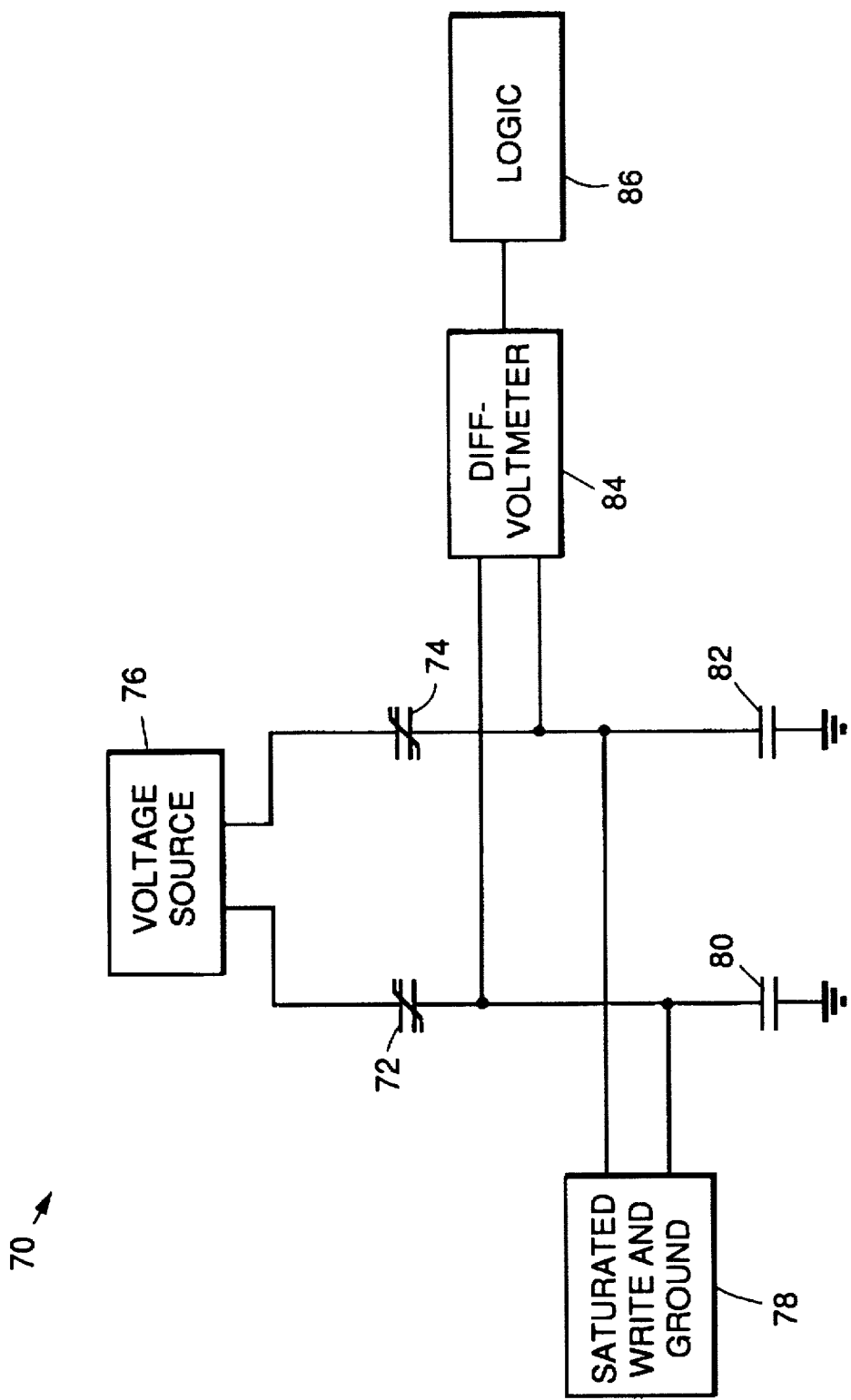
FIG. 4 is a schematic drawing of a basic memory unit using two ferroelectric capacitors or one ferroelectric capacitor and a linear capacitor, in parallel.

Referring to the embodiment of a memory unit 70 illustrated in FIG. 4, the first sides of a first ferroelectric capacitor 72 and a second ferroelectric capacitor 74 are connected in parallel to a variable voltage source 76. The second sides of the ferroelectric capacitors 72 and 74 are connected to a write/ground source 78 having the same function as the saturating voltage source 56 and the ground 58 of FIG. 3. The second sides are also connected to a capacitance or differential capacitance measuring instrument. In this case, the second sides are connected to ground through respective measurement capacitors 80 and 82, and to a differential voltmeter 84. The differential voltmeter may be supplied with an isolation buffer to ensure that the reading of the capacitance states cannot alter these states. A read logic unit 86 interprets the relative magnitude of the sensed capacitance differences. These elements operate in the same manner as discussed in relation to the embodiment of FIG. 3, except as discussed next.

In operation, the first ferroelectric capacitor 72 is driven to one of the zero field capacitance states and the second ferroelectric capacitor 74 is driven to the other of the zero field capacitance states. To write a "1", for example, the first ferroelectric capacitor is driven to the lower zero field capacitance and the second ferroelectric capacitor is driven to the higher zero field capacitance. To write a "0" in this example, the first ferroelectric capacitor is driven to the higher zero field capacitance and the second ferroelectric capacitor is driven to the lower zero field capacitance. The data is read by determining which of the two capacitors has the higher capacitance, and there is no need to establish the absolute capacitance values.

The memory unit 70 also is operable if only one of the capacitors 72 and 74 is a ferroelectric capacitor and the other is a conventional linear capacitor.

The Ramer-Drab Effect has been demonstrated in the Y1 material. A ferroelectric capacitor was constructed which had a first zero field capacitance of about 3.42 pf (picofarads) when measured one second after being established. The capacitor had a second zero field capacitance of about 3.77 pf when measured one second after being established. The stability of the capacitance difference was determined by establishing the zero field capacitance state, measuring the capacitance, allowing the ferroelectric capacitor to sit for period of time, and then remeasuring the capacitance. It was projected from measurements extending to $10^4$ seconds that, although the capacitance values change slightly over time, they are sufficiently stable that the capacitance difference of the zero field capacitance states does not fall to 25 percent of the original difference until about $10^{12}$ seconds. The usefulness of the Ramer-Drab as a basis for stable, long-term memory is thereby proved.

A demonstration memory device like that shown in FIG. 4 and discussed earlier was constructed, except that the ferroelectric capacitor 74 was replaced by a linear capacitor as discussed earlier. The ferroelectric capacitor used Y1 as the insulator material, was 0.18 micrometers thick, and was 100×100 micrometers in lateral dimensions. A data bit was successfully stored and read by the approaches previously described. To determine whether the memory unit had a truly nondestructive readout, $10^5$ simulated read pulses were applied without any refresh of the stored data, and then the stored data was again successfully read. There was substantially no degradation of the measured capacitances after $10^5$ reads without refresh.

Figure 5:
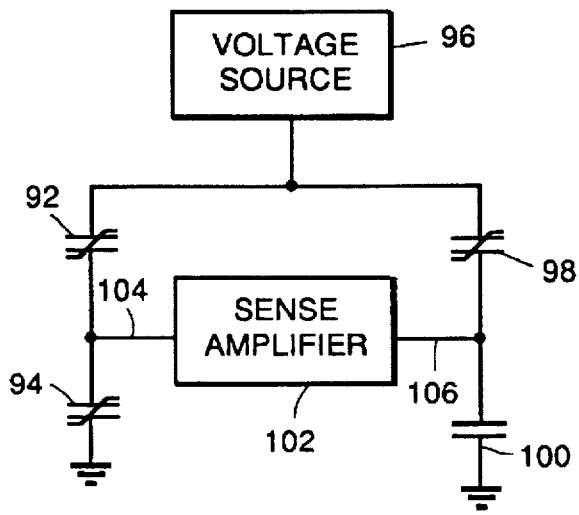
FIG. 5 is a schematic drawing of a basic memory unit using two ferroelectric capacitors in series.

FIG. 5 depicts another type of memory unit 90 utilizing the ferroelectric capacitor exhibiting the Ramer-Drab Effect. A first ferroelectric capacitor 92 and a second ferroelectric capacitor 94 are connected in series to a voltage source 96 and act as the data storage cell. A linear first sense capacitor 98 and a linear second sense capacitor 100 are connected in series to the same voltage source 96 and act as a reference cell. A sense amplifier 102 is connected between the two series arrays, with a first input 104 communicating with the line connecting the ferroelectric capacitors 92 and 94, and a second input 106 communicating with the line connecting the sense capacitors 98 and 100. Information is written to this memory unit 90 generally in the same manner as described previously, by charging the two ferroelectric capacitors 92 and 94 to the different capacitances as established by the Ramer-Drab Effect. Information is read from this memory unit by measuring the capacitances of the two ferroelectric capacitors 94.

Figure 6:
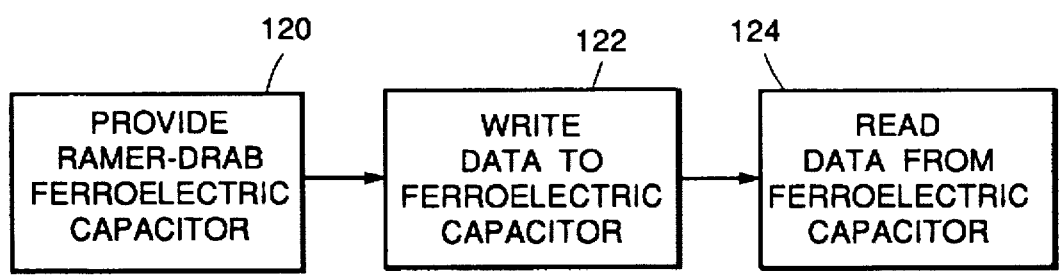
FIG. 6 is a block flow diagram for the method of practicing the invention.

FIG. 6 depicts a preferred method for practicing the method of the invention. A memory cell based upon a ferroelectric capacitor exhibiting the Ramer-Drab effect is provided, numeral 120. This memory cell can be of any of the types discussed herein, or other cells based upon this physical effect. A first capacitance state is written to the ferroelectric capacitor, and, where there is a second ferroelectric capacitor in the cell, a second memory state is written to that second ferroelectric capacitor, numeral 122. The data is later read from the cell by sensing the capacitance values or sense of the capacitance differences, numeral 124, as discussed above. Reading is preferably accomplished without switching the charge state of the ferroelectric capacitor and without applying a DC bias field to the ferroelectric capacitor.

The present invention provides an important advance for ferroelectric memories. The utilization of the Ramer-Drab Effect allows a true NDRO memory cell to be constructed. The memory cell can be written and read in various ways, and various modifications can be made to improve its performance as desired. Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A memory unit, comprising:
   a ferroelectric capacitor having an insulator formed of a ferroelectric material characterized by a zero field capacitance which is controllably variable between a full capacitance state and a partial capacitance state according to the electrical charge path by which the zero field capacitance is reached;
   means for writing a full capacitance state to the ferroelectric capacitor at a first time and a partial capacitance state to the ferroelectric capacitor at a second time, the different capacitance states reflecting different stored data values; and
   means for reading the capacitance of the ferroelectric capacitor.

2. The memory unit of claim 1, wherein the memory unit further includes:
   a second ferroelectric capacitor in parallel with the ferroelectric capacitor and having an insulator with the same materials properties as the ferroelectric material of the ferroelectric capacitor.

3. The memory unit of claim 1, wherein the memory unit further includes:
   a linear capacitor in parallel with the ferroelectric capacitor.

4. The memory unit of claim 1, wherein the memory unit further includes:
   a second capacitor in parallel with the ferroelectric capacitor, and
   wherein the means for writing includes means for writing different capacitance full or partial states simultaneously into the ferroelectric capacitor and the second capacitor.

5. The memory unit of claim 4, wherein the means for reading includes means for determining which of the first capacitor and the second capacitor has a higher capacitance.

6. The memory unit of claim 4, wherein the means for reading includes means for determining the capacitance of the ferroelectric capacitor and the capacitance of the second capacitor.

7. The memory unit of claim 1, wherein the ferroelectric material is characterized by
   a first zero field capacitance following saturation of the polarization by a first applied voltage applied in a first polarization direction, and
   a second zero field capacitance following saturation of the polarization by the first applied voltage applied in the first polarization direction followed by partial depolarization by a second voltage applied in a direction opposite to the first polarization direction.

8. The memory unit of claim 1, wherein the means for reading includes
   means for reading the capacitance of the ferroelectric capacitor without switching the charge state of the ferroelectric capacitor and without applying a DC bias field to the ferroelectric capacitor.

9. A memory unit, comprising:
   two ferroelectric capacitors, the ferroelectric capacitors each having an insulator formed of a ferroelectric material characterized by
   a first zero field capacitance following full or partial saturation of the polarization by a first applied voltage applied in a first polarization direction, and
   a second zero field capacitance following full or partial saturation of the polarization by the first applied voltage in the first polarization direction followed by partial depolarization by a second voltage applied in a direction opposite to the first polarization direction;
   means for writing a different polarization state to each of the two ferroelectric capacitors; and
   means for determining the relative capacitances of the two ferroelectric capacitors.

10. The memory unit of claim 9, wherein the means for reading includes means for determining which of the ferroelectric capacitors has a higher capacitance.

11. The memory unit of claim 9, wherein the means for reading includes means for determining the capacitance of the each of the two ferroelectric capacitors.

12. The memory unit of claim 11, wherein the memory unit further includes:
   a second ferroelectric capacitor in parallel with the ferroelectric capacitor and having an insulator with the same ferroelectric materials properties as the ferroelectric material of the ferroelectric capacitor.

13. The memory unit of claim 11, wherein the memory unit further includes:
   a linear capacitor in parallel with the ferroelectric capacitor.

14. The memory unit of claim 9, wherein the means for reading includes
   means for reading the capacitance of the two ferroelectric capacitors without switching the charge state of the ferroelectric capacitors and without applying a DC bias field to the ferroelectric capacitors.

15. The memory unit of claim 9, wherein the means for reading includes
   means for reading the capacitance of the ferroelectric capacitor without switching the charge state of the ferroelectric capacitor and without applying a DC bias field to the ferroelectric capacitor.

16. A memory unit, comprising:
   a ferroelectric capacitor having an insulator formed of a ferroelectric material characterized by
   a first zero field capacitance following full or partial saturation of the polarization by a first applied voltage applied in a first polarization direction, and
   a second zero field capacitance following full or partial saturation of the polarization by the first applied voltage applied in the first polarization direction followed by partial depolarization by a second voltage applied in a direction opposite to the first polarization direction;

means for writing two different polarization states to the ferroelectric capacitor at different times, the different polarization states reflecting different stored data values; and means for reading the capacitance of the ferroelectric capacitor.

17. A method for storing and recovering data, comprising the steps of:

providing a ferroelectric capacitor having an insulator formed of a ferroelectric material characterized by a zero field capacitance which is controllably dependent upon the electrical charging path by which the zero field capacitance is reached;

writing one of a first capacitance state and a second capacitance state to the ferroelectric capacitor, the first capacitance state being written by applying a first voltage in a first polarization direction sufficient to fully or partially saturate the polarization of the ferroelectric capacitor, and the second capacitance state being written by applying the first voltage in the first polarization direction sufficient to fully or partially saturate the polarization of the ferroelectric capacitor, and thereafter applying a second voltage in a direction opposite to the first polarization direction to achieve partial depolarization of the ferroelectric capacitor; and reading the written capacitance state of the ferroelectric capacitor.

* * * * *

UNITED STATES PATENT AND TRADEMARK OFFICE
CERTIFICATE OF CORRECTION

| | | |
|---|---|---|
| PATENT NO. | : 5,729,488 | Page 1 of 1 |
| DATED | : March 17, 1998 | |
| INVENTOR(S) | : John J. Drab and O. Glenn Ramer | |

It is certified that error appears in the above-identified patent and that said Letters Patent is hereby corrected as shown below:

<u>Column 1,</u>
Line 5, insert the following:

-- This invention was made with Government support under Contract No. N00030-93-C-0002 awarded by the Department of the Navy. The Government has certain rights in this invention. --

Signed and Sealed this

Eighteenth Day of June, 2002

*Attest:*

*Attesting Officer*

JAMES E. ROGAN
*Director of the United States Patent and Trademark Office*